(12) United States Patent
Gomez Gomez

(10) Patent No.: US 11,353,508 B2
(45) Date of Patent: Jun. 7, 2022

(54) METHOD, SYSTEM AND DEVICE TO TEST A PLURALITY OF DEVICES BY COMPARING TEST RESULTS OF TEST CHAINS OF THE PLURALITY OF DEVICES

(71) Applicant: STMICROELECTRONICS SA, Montrouge (FR)

(72) Inventor: Ricardo Gomez Gomez, Grenoble (FR)

(73) Assignee: STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 17/031,713

(22) Filed: Sep. 24, 2020

(65) Prior Publication Data

US 2021/0096181 A1 Apr. 1, 2021

(30) Foreign Application Priority Data

Sep. 27, 2019 (FR) ...................................... 1910708

(51) Int. Cl.

| G01R 31/3185 | (2006.01) |
| G01R 31/3177 | (2006.01) |
| G06F 11/267 | (2006.01) |
| G06F 11/16 | (2006.01) |
| G06F 11/18 | (2006.01) |
| G01R 31/3181 | (2006.01) |

(52) U.S. Cl.
CPC . *G01R 31/318566* (2013.01); *G01R 31/3177* (2013.01); *G06F 11/1629* (2013.01); *G06F 11/183* (2013.01); *G06F 11/267* (2013.01); *G01R 31/31816* (2013.01)

(58) Field of Classification Search
CPC ........ G01R 31/318566; G01R 31/3177; G01R 31/31816; G06F 11/1629; G06F 11/183; G06F 11/267; G06F 11/0751
See application file for complete search history.

(56) References Cited

U.S. PATENT DOCUMENTS

| 6,892,345 B1 * | 5/2005 | Ghameshlu | ......... G06F 11/1679 327/141 |
| 6,928,606 B2 * | 8/2005 | Savaria | .......... G01R 31/318536 714/729 |
| 6,941,498 B2 * | 9/2005 | Hartano | ........... G01R 31/31705 714/729 |
| 7,013,414 B2 * | 3/2006 | Takeshige | .............. G11C 29/40 714/719 |
| 7,036,059 B1 * | 4/2006 | Carmichael | ......... G06F 11/1004 714/725 |
| 2001/0038304 A1 | 11/2001 | Waldie et al. | |
| 2005/0154947 A1 | 7/2005 | Taniguchi | |
| 2006/0242508 A1 | 10/2006 | Simpson et al. | |

(Continued)

*Primary Examiner* — Cynthia Britt
(74) *Attorney, Agent, or Firm* — Seed IP Law Group LLP

(57) ABSTRACT

A method tests a plurality of devices, each device including a test chain having a plurality of positions storing test data. The testing includes comparing test data in a last position of the test chain of each of the devices. The test data in the test chains of the devices is shifted forward by one position. The shifting includes writing test data in the last position of a test chain to a first position in the test chain. The comparing and the shifting are repeated until the test data in the last position of each test chain when the testing is started is shifted back into the last position of the respective test chain. The plurality of devices may have a same structure and a same functionality.

22 Claims, 7 Drawing Sheets

(56) References Cited

U.S. PATENT DOCUMENTS

| | | |
|---|---|---|
| 2007/0028157 A1 | 2/2007 | Drake et al. |
| 2008/0086666 A1* | 4/2008 | Kawamura .... G01R 31/318544 714/729 |
| 2009/0049348 A1* | 2/2009 | Iwai ................... G11C 29/1201 714/718 |
| 2010/0088565 A1 | 4/2010 | Chandra |
| 2016/0116532 A1 | 4/2016 | Dong et al. |

* cited by examiner

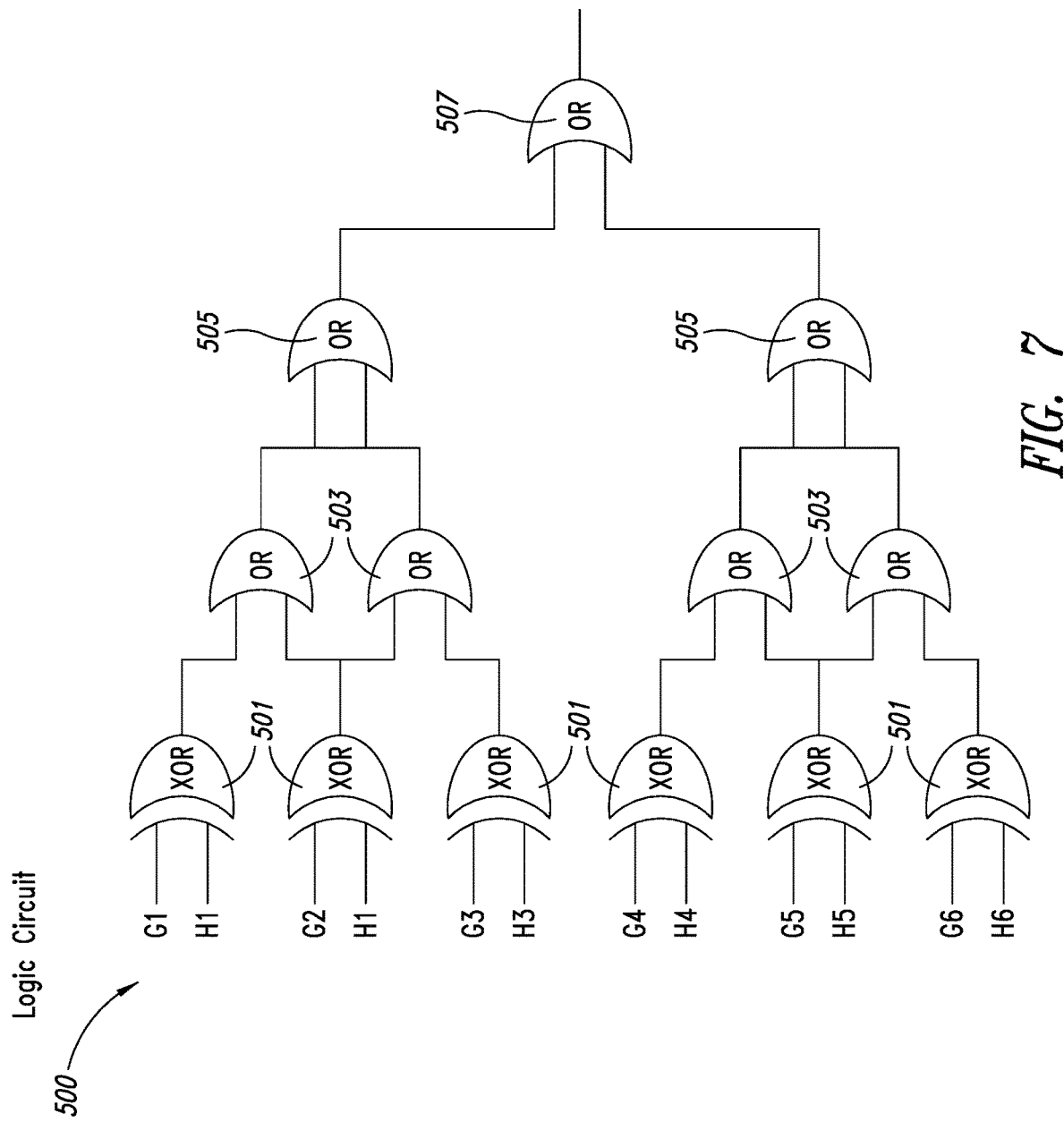

METHOD, SYSTEM AND DEVICE TO TEST A PLURALITY OF DEVICES BY COMPARING TEST RESULTS OF TEST CHAINS OF THE PLURALITY OF DEVICES

BACKGROUND

Technical Field

The present disclosure generally concerns the detection of errors in an electronic device, and more particularly the detection of errors by comparison of electronic devices. The present disclosure further concerns a device enabling to implement such an error detection method in an electronic device.

Description of the Related Art

The use, in an electronic device, of electronic devices, such as processors, microprocessors, integrated systems, etc., is more and more submitted to performance and reliability constraints. To comply with certain standards and/or a quality charter, such devices are generally coupled with detection and/or error correction devices. Indeed, operating errors may come up on execution of one of these devices and disturb their operations and/or the general operation of an electronic system comprising them.

Several types of errors, or faults, may occur within an electronic device. As an example, certain errors (SPF, Single Point Fault) directly or rapidly cause an effect on the operation of the electronic device and/or on the general operation of an electronic system comprising it. Such errors are easily recognizable by observation of the device and/or of the system. Other errors, called latent errors (LF, Latent Fault), do not instantaneously cause a malfunction, but may cause one, for example, later on, or when they are combined with other errors. Such errors are more difficult to detect since a simple observation of the operation of the device or of the system is generally not sufficient.

BRIEF SUMMARY

In an embodiment, a method comprises testing a plurality of devices, each device including a test chain having a plurality of positions storing test data. The testing includes: comparing test data in a last position of the test chain of each of the devices; shifting test data in the test chains of the devices forward by one position, the shifting including writing test data in the last position of a test chain to a first position in the test chain; and repeating the comparing and the shifting until the test data in the last position of each test chain when the testing is started is shifted back into the last position of the respective test chain. In an embodiment, the method comprises storing pieces of test data in test points. In an embodiment, the test points are registers or flip-flops. In an embodiment, the test data comprises binary words. In an embodiment, the test data comprises one-bit binary words. In an embodiment, the devices each comprise a plurality of test chains. In an embodiment, the plurality of devices comprises more than two devices. In an embodiment, the method comprises generating an output signal based on the comparing. In an embodiment, the plurality of devices have a same structure and a same function.

In an embodiment, a device comprises: a comparator; and control circuitry coupled to the comparator, wherein the control circuitry, in operation, controls testing of a plurality of electronic circuits, each electronic circuit including a test chain having a plurality of positions storing test data. The testing includes: comparing test data in a last position of the test chain of each of the electronic circuits; shifting test data in the test chains of the electronic circuits forward by one position, the shifting including writing test data in the last position of a test chain to a first position in the test chain; and repeating the comparing and the shifting until the test data in the last position of each test chain when the testing is started is shifted back into the last position of the respective test chain. In an embodiment, the control circuitry comprises a plurality of feedback loops, each coupling an input and an output of a respective test chain. In an embodiment, each feedback loop comprises a multiplexer. In an embodiment, the comparator comprises an XOR logic gate.

In an embodiment, a system comprises: a plurality of electronic devices, each including a test chain having a plurality of positions storing test data; and testing circuitry, coupled to the plurality of electronic devices, and which, in operation, tests the plurality of electronic devices. The testing includes: comparing test data in a last position of the test chain of each of the electronic devices; shifting test data in the test chains of the electronic devices forward by one position, the shifting including writing test data in the last position of a test chain to a first position in the test chain; and repeating the comparing and the shifting until the test data in the last position of each test chain when the testing is started is shifted back into the last position of the respective test chain. In an embodiment, the test chains comprise test points, which, in operation, store pieces of test data. In an embodiment, the test points comprise registers or flip-flops. In an embodiment, the test data comprises binary words. In an embodiment, the test data comprises one-bit binary words. In an embodiment, the electronic devices each comprise a plurality of test chains. In an embodiment, the plurality of devices comprises more than two devices. In an embodiment, the testing includes generating an output signal based on the comparing. In an embodiment, the plurality of electronic devices have a same structure and a same function.

An embodiment provides an error detection method comprising comparing at least two identical electronic devices comprising at least one of test data, comprising the steps of:
  (a) the test data in the last position in said chain of the two devices are compared;
  (b) the other test data are shifted forward by one position in their data chain;
  (c) the test data of step (a) are written in the first position in their initial chain,
  steps (a), (b), and (c) are repeated until all the test data have recovered their initial location.

According to an embodiment, each piece of test data is stored in a test point.

According to an embodiment, the test points are registers or flip-flops.

According to an embodiment, the test data are binary words.

According to an embodiment, the test data are one-bit binary words.

According to an embodiment, the electronic devices comprise two or more than two chains of test data.

According to an embodiment, the method is a method for comparing more than two identical electronic devices.

According to an embodiment, the result of the comparison of step (a) is delivered in a signal.

Another embodiment provides a device for comparing adapted to execute the method described above.

According to an embodiment, the device is adapted to compare at least two identical electronic devices comprising at least one chain of test data, comprising:
- a comparator circuit; and
- at least two feedback loops, each coupling an input and an output of one of said chains.

According to an embodiment, each feedback loop couples the input and the output of one of said via a multiplexer.

According to an embodiment, the comparator circuit comprises an XOR logic gate.

An electronic system comprising:
- at least two identical electronic devices comprising at least one chain of test data; and
- the comparison device described above.

BRIEF DESCRIPTION OF THE DRAWINGS

The foregoing and other features and advantages will be discussed in detail in the following non-limiting description of specific embodiments in connection with the accompanying drawings, among which:

FIG. 7 shows a logic circuit of a comparator of an embodiment of an error detection device.

DESCRIPTION OF THE EMBODIMENTS

Figure 1:
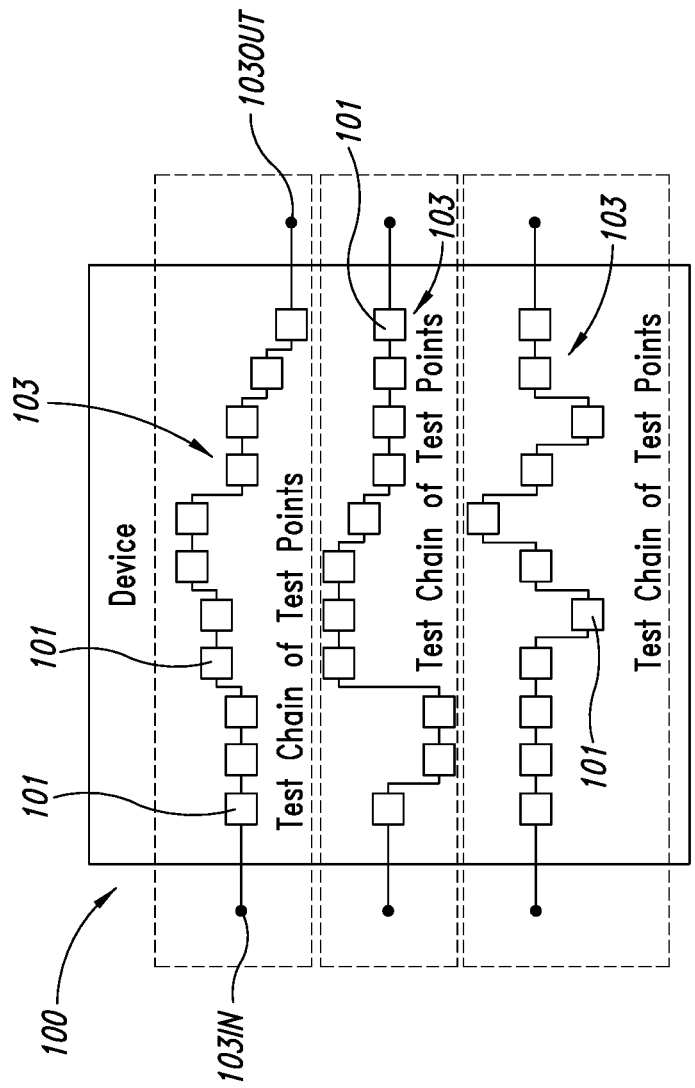
FIG. 1 schematically shows in the form of blocks an electronic device.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front," "back," "top," "bottom," "left," "right," etc., or relative positions, such as terms "above," "under," "upper." "lower," etc., or to terms qualifying directions, such as terms "horizontal," "vertical," etc., unless otherwise specified, it is referred to the orientation of the drawings.

The terms "about," "substantially," and "approximately" are used herein to designate a tolerance of plus or minus 10%, of plus or minus 5%, of the value in question.

FIG. 1 schematically shows in the form of blocks an electronic device 100. Electronic device 100 is for example a processor, a microprocessor, an integrated system, a control unit, etc.

Electronic device 100 comprises a plurality of test points 101. Each test point 101 stores functional data, used during the execution of the device, and called test data during a test phase. As an example, a test point 101 is a register, or one or more flip-flops. The test data are for example a binary word coded over N bits. As an example, N is in the range from 1 to 64 bits, for example, equal to one. The test points 101 are for example arranged in device 100 as soon as it is designed, and are each coupled to one or a plurality of modules or components of device 100. The test data stored in a test point 101 are data providing an indication of the state of the component(s) having the test point attached thereto. The test points 101 are organized in one or a plurality of test chains 103. Each test chain 103 comprises an input point 103IN and an output point 103OUT.

Device 100 may comprise as many test points as desired, organized in as many test chains as desired. The test chains 103 may all have the same number of test points, but may as a variation have different numbers of test points. As an example, the device 100 illustrated in FIG. 1 for example comprises thirty-three test points 101 organized in three test chains 103, each comprising eleven test points 101.

A phase of error, or faults, detection or test of device 100 generally comprises reading and comparing all the data stored in the test points. The number of test points 101 comprised within device 100 thus has an influence on the duration of a test phase. Indeed, the more test points 101 are present in device 100, the longer the test phase risks being. The organization of test points 101 in test chains 103 may enable to shorten this time period by enabling to read a plurality of test points 101 in parallel.

A device and a method of error detection in device 100 will be described in relation with FIGS. 2 and 3.

Figure 2:
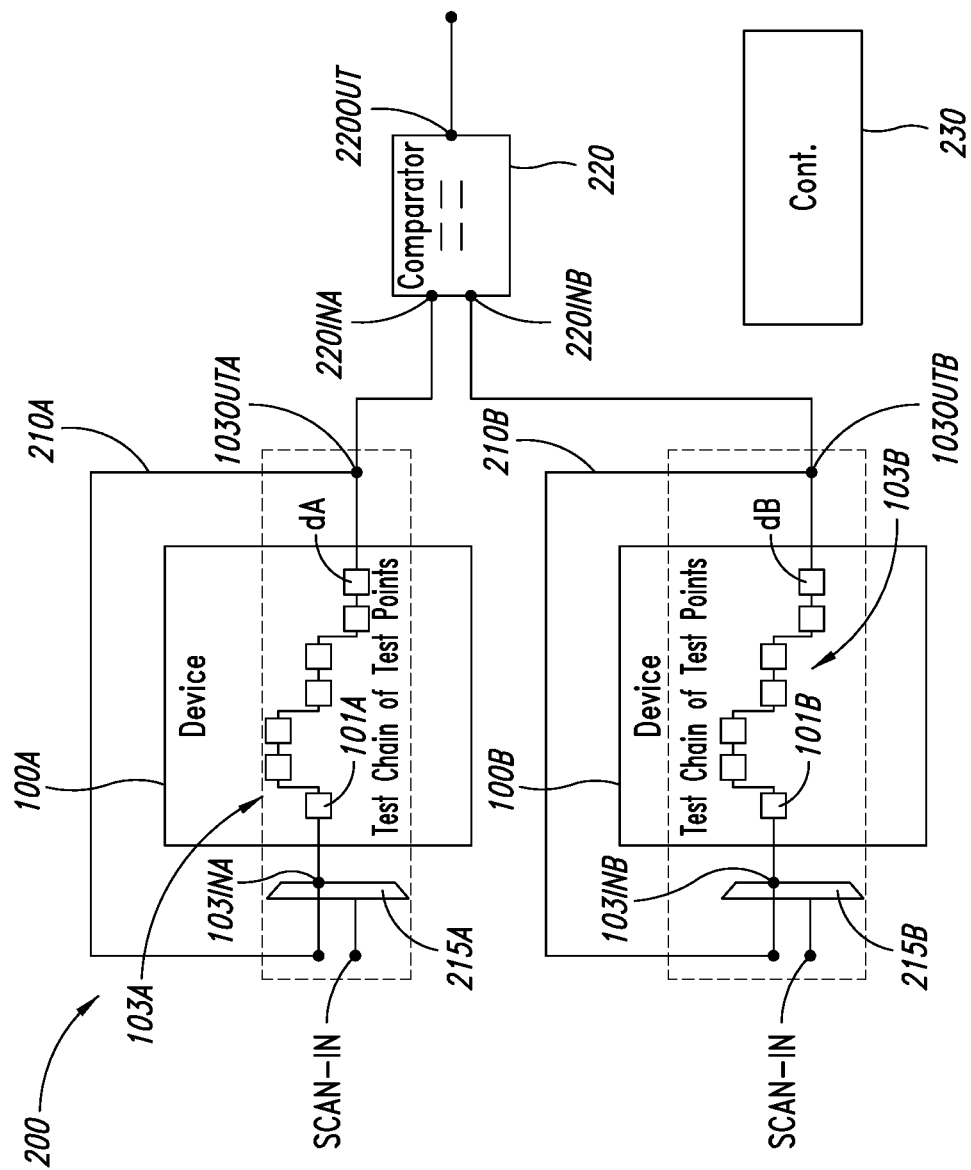
FIG. 2 schematically shows in the form of blocks an embodiment of a device of error detection in an electronic device of the type of the device of FIG. 1.

FIG. 2 schematically shows in the form of blocks an embodiment of a device 200 of error detection by comparison of two devices 100A and 100B of the type of device 100 of FIG. 1. The devices 100A and 100B may be identical in their structure, and also processed the same operating operations and should have identical test data.

According to an embodiment, each device 100A, respectively 100B, comprises a test chain 103A, respectively 103B, comprising test points 101A, respectively 101B. As an example, each test chain 103A, respectively 103B, comprises seven test points 101A, respectively 101B. Each test chain 103A, respectively 103B, comprises an input 103INA, respectively 103INB, and an output 103OUTA, respectively 103INB. The last test point 101A, respectively 101B, of each test chain 103A, respectively 103B, stores a data dA, respectively dB.

Detection circuit 200 comprises two feedback loops 210A and 201B. Feedback loop 210A couples, or connects, output 103OUTA of the test chain 103A of device 100A to an input of a multiplexer 215A. Feedback loop 210B couples, or connects, output 103OUTB of the test chain 103B of device 100B to an input of a multiplexer 215B. Each multiplexer 215A, respectively 215B, comprises a second input receiving a signal SCAN-IN. Each multiplexer 215A, respectively 215B, further comprises an output coupled, or connected, to the input of test chain 103A, respectively 103B. Multiplexers 215A and 215B are entry point to insert data to the test chains 103A and 103B, and let the possibility to insert data from feedback loops 210A, and 210B or from another pin or device.

Detection circuit 200 further comprises a comparator circuit 220 comprising two inputs 220INA and 220INB, and an output 220OUT. Input 220INA is coupled, or connected, to output 103OUTA of the test chain 103A of device 100A. Input 220INB is coupled, or connected, to output 103OUTB of the test chain 103B of device 100B. Output 220OUT delivers a signal expressing the result of the comparison between the two signals provided as an input. Comparator circuit 220 is for example an XOR-type logic gate. Other examples of comparator circuits adapting to different types of devices will be described in relation with FIGS. 6 and 7.

As illustrated, detection circuit 200 comprises control circuitry 230, which in operation, controls multiplexers 215A, 215B, etc. In some embodiments, the control circuitry 230 may be combined with or include the comparator circuit 220.

An error detection method using detection device 200 will now be described in relation with FIGS. 3 and 4.

Figure 3:
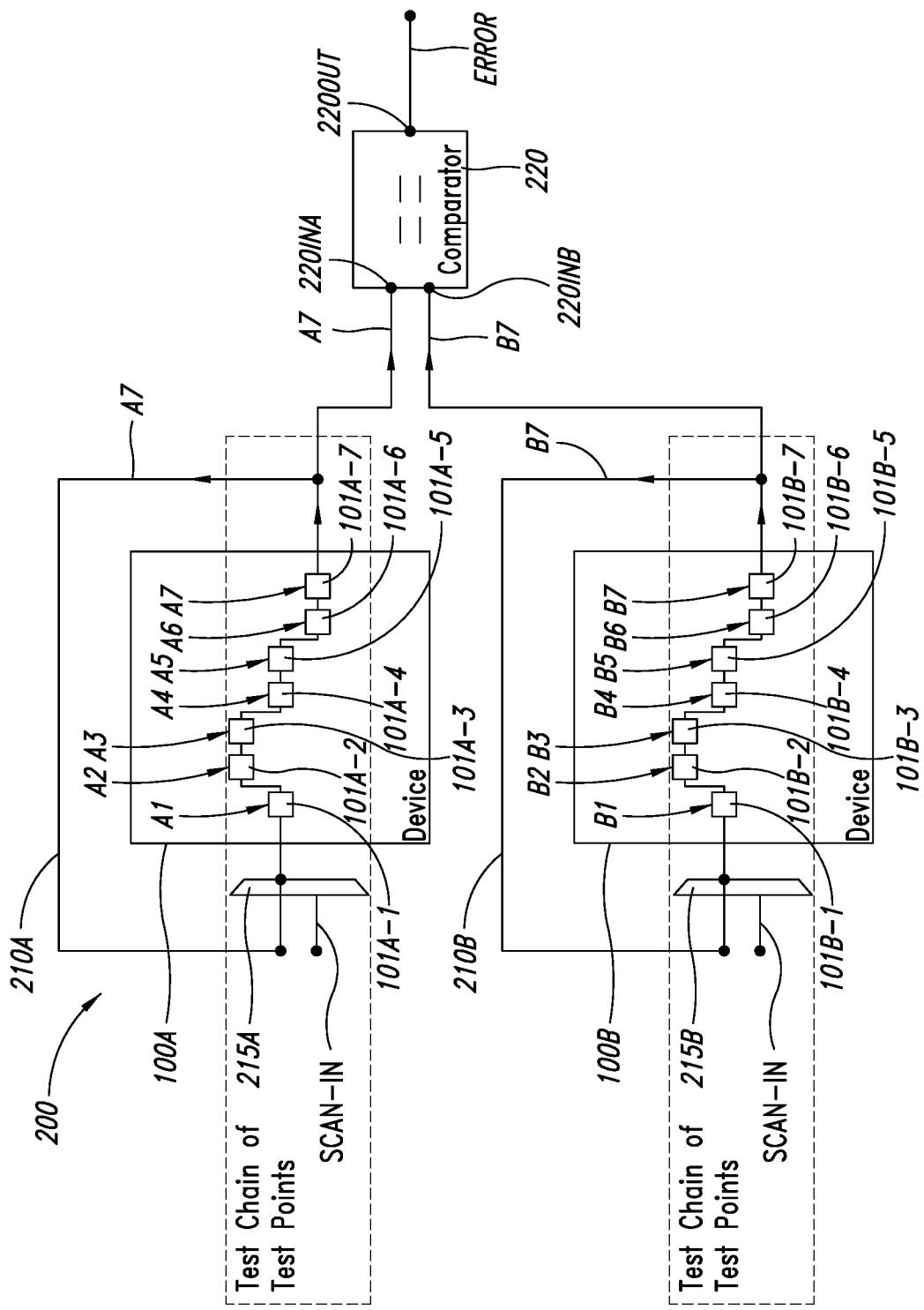
FIG. 3 illustrates an embodiment of the implementation of the device of FIG. 2.
Figure 4:
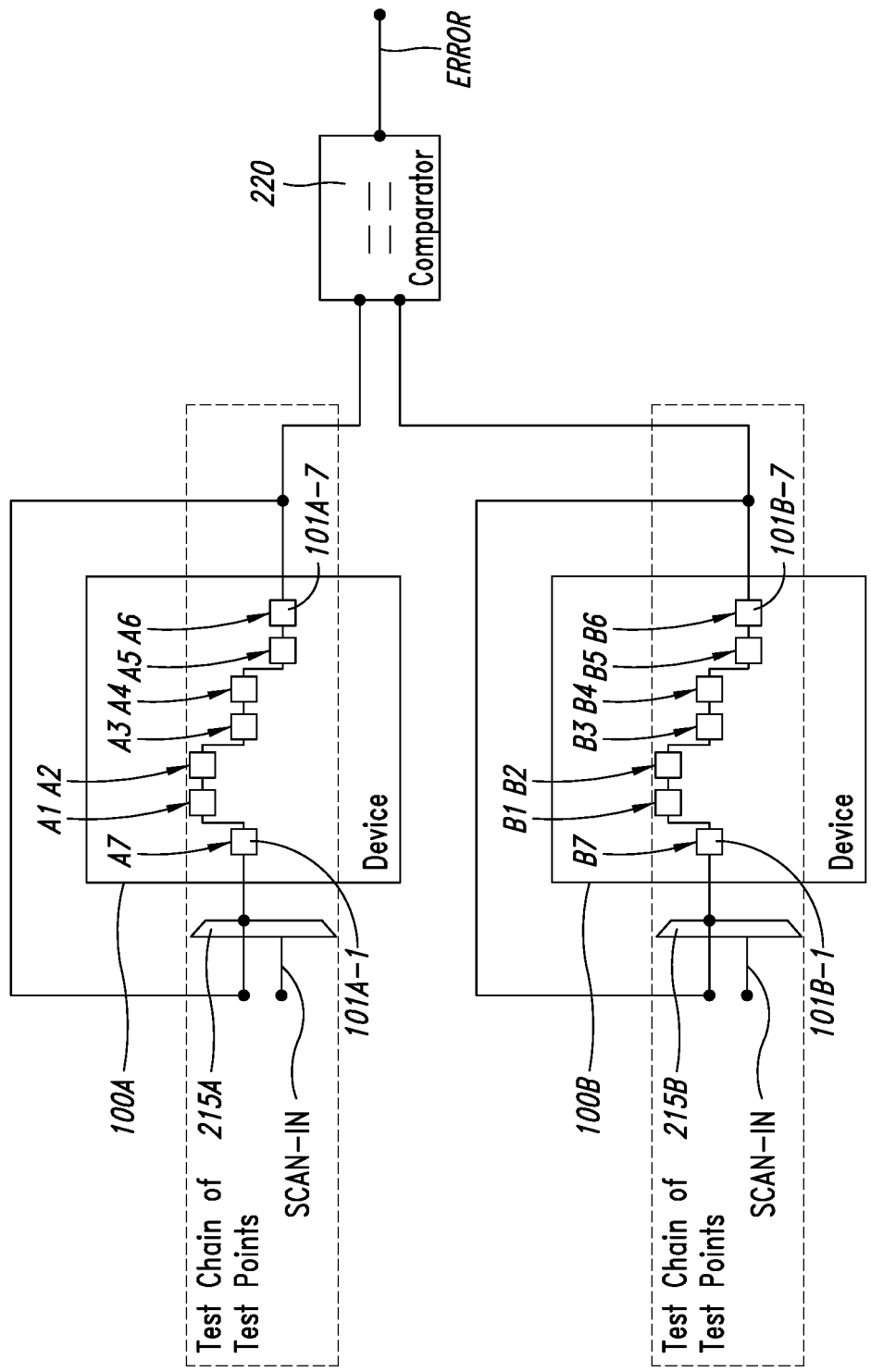
FIG. 4 illustrates an embodiment of the implementation of the device of FIG. 2.

FIGS. 3 and 4 schematically illustrate in the form of blocks the implementation of the detection device 200 described in relation with FIG. 2.

The test points of test chains 103A and 103B are numbered from 101A-1 to 101A-M, and from 101B-1 to 101B-M, and stores data A1 to AM, and B1 to BM. In particular in FIGS. 3 and 4, the number of test points per test chain is seven, and thus the test points of test chains 103A and 103B are numbered from 101A-1 to 101A-7, and 101B-1 to 101B-7, and store data A1 to A7, and B1 to B7.

At the beginning of an error detection phase (FIG. 3), data AM and BM (A7 and B7 in FIG. 3), stored in the last test points 101AM and 101BM of test chains 103A and 103B, are sent to inputs 220INA and 220INB of comparator 220 to be compared therein. Devices 100A and 100B, due to their structure and to their state, data AM and BM are supposed to be identical. If such is not the case, then an error is detected, and the comparator delivers an error signal ERROR on its output 220OUT.

Each piece of data AM, respectively BM, is further sent by feedback loop 210A, respectively 201B, to an input of multiplexer 215A, respectively 215B.

Once data AM and BM have been compared (FIG. 4), data Ai, with i varying from 1 to M−1, are shifted towards the next test point 101A-i+1, and data Bi are shifted to the next test point 101B-i+1. Further, data AM, respectively BM, are written without being modified into test point 101A-1, respectively 101B-1, by multiplexer 215A, respectively 215B.

The error detection phase carries on with the comparison of the data AM-1 and BM-1 stored in test points 101A-M and 101B-M and with the shifting of the other data in the immediately following test points. The test phase ends once all the data Ai have been compared with data Bi and, through shifts, data AM and BM have returned to their initial position.

An advantage of detection device 200 and of the detection method resulting from its implementation is that it facilitates detecting different types of errors. More particularly, it facilitates detecting errors without observing the operation of devices 100A, 100B or the general operation of the system to which they belong. Detection device 200 thus also facilitates detecting errors (SPF, Single point Fault) having a direct influence on the operation as well as errors (LFM, Latent Fault Metric) which have no immediate influence on the operation of devices 100A and 100B.

Another advantage of detection device 200 is that it is independent from the nature of devices 100A and 100B and may apply to any type of device comprising test chains of the type described in relation with FIG. 1.

Another advantage of detection device 200 is that it is easy to implement in a system comprising electronic devices of the type of the device 100 described in relation with FIG. 1, since it only comprises one comparison circuit, feedback loops, and multiplexers.

Figure 5:
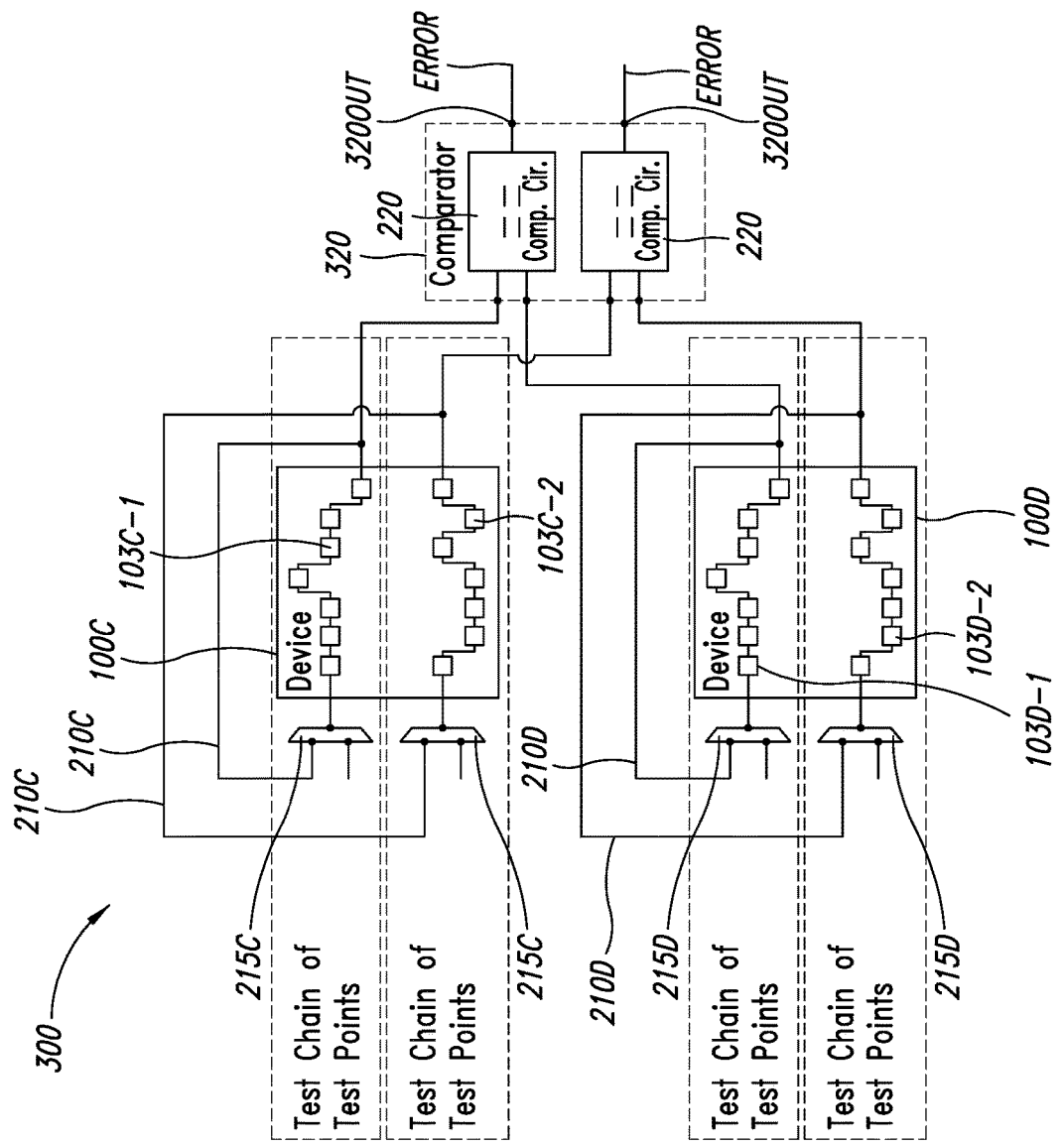
FIG. 5 schematically shows in the form of blocks another embodiment of a device of error detection in an electronic device of the type of the device of FIG. 1.

FIG. 5 schematically shows in the form of blocks an embodiment of an error detection device 300 between two devices 100C and 100D of the type of device 100 of FIG. 1. Devices 100C and 100D may be identical in their structure, and have also processed the same operations and should have identical test data.

Devices 100C and 100D as illustrated are substantially identical to devices 100A and 100B, but each comprise a plurality of test chains rather than one. As an example, in FIG. 5, devices 100C and 100D each comprise two test chains 103C and 103C, 103D and 103D, chains 103C, respectively 103D, being different from one another.

Error detection device 300 is similar to error detection device 200, with the difference that it comprises as many feedback loops 210C, respectively 210D, and multiplexers 215C, respectively 215D, as test chains 103C, respectively 103D. More particularly, each test chain 103C, respectively 103D, has its input coupled, or connected, to an input of a multiplexer 215C, respectively 215D, by a feedback loop 210C, respectively 210D, the output of multiplexer 215C, respectively 215D, being coupled, or connected, to the input of said test chain 103C, respectively 103D. In FIG. 5, device 300 thus comprises four feedback loops 210C and 210D, and four multiplexers 215C and 215D.

Device 300 further comprises a comparator circuit 320 having as many inputs as the total number of test chains 103C and 103D. In FIG. 5, circuit 320 comprises four inputs. Device 300 receives as an input all the outputs of test chains 103C and 103D. More particularly, comparator circuit 320 enables to compare chains 103C and 103D intended to have identical data. Circuit 320 may comprise one or a plurality of outputs 320OUT. In FIG. 5, circuit 320 has two outputs. In the case where circuit 320 comprises a single output, this output may supply a signal representing information of global comparison between the two devices. In the case where circuit 320 comprises a plurality of outputs 320OUT, each output may for example supply a signal representing the comparison between two test chains.

As an example, the comparator circuit comprises as many comparator circuits 220 described in relation with FIG. 2 as test chains in a device 100C, 100D. In FIG. 5, comparator circuit 320 comprises two circuits 220. Other embodiments of comparator circuit 320 will be described in relation with FIGS. 6 and 7.

The operation of device 300 is the same as the operation of device 200 described in relation with FIG. 2, the comparisons of the different sets of test chains 103C, 103D are carried out in parallel.

Figure 6:
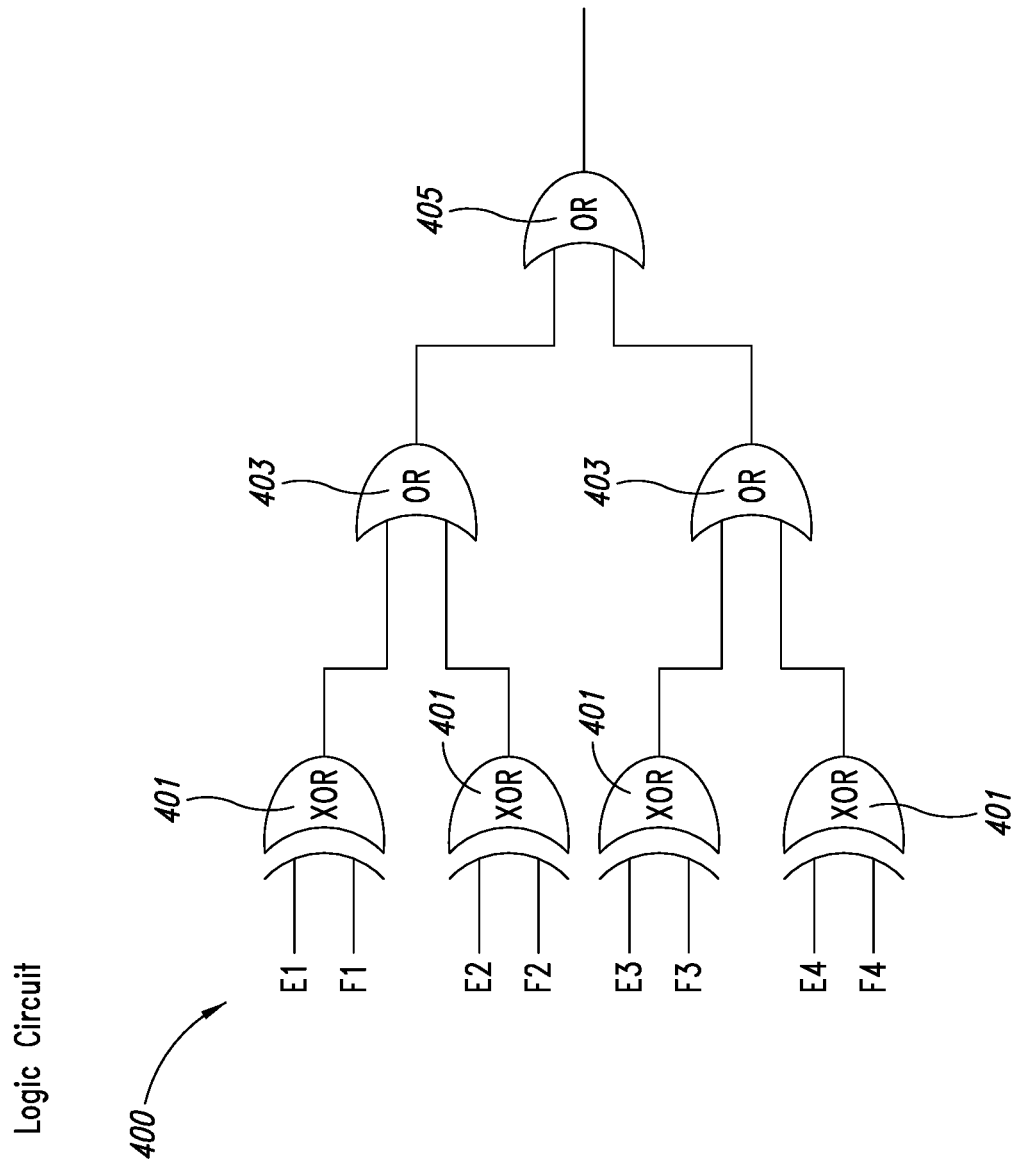
FIG. 6 shows a logic circuit of a comparator of an embodiment of an error detection device.

FIG. 6 shows a logic circuit 400 of a comparison circuit of a detection device of the type described in relation with FIGS. 2 and 3.

Logic circuit 400 is a logic circuit enabling to compare the data of two devices E and F, each comprising four test chains E1 to E4, respectively F1 to F4. The data of test chain Ei, with i varying from 1 to 4, are compared with the data of test chain Fi.

Logic circuit 400 comprises a first stage comprising four XOR-type logic gates 401. Each of these gates receives as an input data from a test chain Ei and from a test chain Fi to compare them.

Logic circuit 400 comprises a second stage comprising two OR-type logic gates 403. Each of gates 403 receives as an input an output of one of the logic gates 401 of the first stage.

Logic circuit 400 comprises a third stage comprising an OR-type logic gate 405. The logic gate receives as an input the outputs of the logic gates 403 of the second stage.

FIG. 7 shows a logic circuit 500 of a comparison circuit of a detection device of the type described in relation with FIGS. 2 and 3.

Logic circuit 500 is a logic circuit enabling to compare the data of two identical devices G and H, each comprising six test chains G1 to G6, respectively H1 to H6. The data of test chain Gi, with i varying from 1 to 6, is compared with the data of test chain Hi.

Logic circuit 500 comprises a first stage comprising six XOR-type logic gates 501. Each of these gates receives as an input data from a test chain Gi and from a test chain Hi to compare them.

Logic circuit 500 comprises a second stage comprising four OR-type logic gates 503. Each of these gates receives as an input an output of one of the logic gates 501 of the first stage. More particularly, certain gates 501 deliver their output to a plurality of gates 503 (see FIG. 7).

Logic circuit 500 comprises a third stage comprising two OR-type logic gates 505. Each logic gate 505 receives as an input the outputs of the logic gates 503 of the second stage.

Logic circuit 500 comprises a fourth stage comprising an OR-type logic gate 507. The logic gate receives as an input the outputs of the logic gates 505 of the third stage.

Various embodiments and variations have been described. It will be understood by those skilled in the art that certain features of these various embodiments and variations may be combined, and other variations will occur to those skilled in the art. In particular, error detection devices 200 and 300 may be adapted to compare more than two devices of the type of device 100 described in relation with FIG. 1.

Finally, the practical implementation of the described embodiments and variations is within the abilities of those skilled in the art based on the functional indications given hereabove.

Some embodiments may take the form of or comprise computer program products. For example, according to one embodiment there is provided a computer readable medium comprising a computer program adapted to perform one or more of the methods of functions described herein. The medium may be a physical storage medium, such as for example a Read Only Memory (ROM) chip, or a disk such as a Versatile Disk (DVD-ROM), Compact Disk (CD-ROM), a hard disk, a memory, a network, or portable media article to be read by an appropriate drive or via an appropriate connection, including as encoded in one or more barcodes or other related codes stored on one or more such computer-readable mediums and being readable by an appropriate reader device.

In some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including micro controllers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    testing a plurality of devices, each device including a test chain having a plurality of test point positions, each test point position storing test data indicative of a state of a component coupled to the test point position, the testing including:
        comparing test data in a last test point position of the test chain of each of the devices;
        shifting test data in the test chains of the devices forward by one test point position, the shifting including writing test data in the last test point position of a test chain to a first test point position in the test chain; and
        repeating the comparing and the shifting until the test data in the last test point position of each test chain when the testing is started is shifted back into the last test point position of the respective test chain.

2. The method of claim 1, comprising storing pieces of test data in the test point positions.

3. The method of claim 2, wherein the test point positions comprise registers or flip-flops.

4. The method of claim 1, wherein the test data comprises binary words.

5. The method of claim 1, wherein the test data comprises one-bit binary words.

6. The method of claim 1, wherein the devices each comprise a plurality of test chains.

7. The method of claim 1, wherein the plurality of devices comprises more than two devices.

8. The method of claim 1, comprising generating an output signal based on the comparing.

9. The method of claim 1, wherein the plurality of devices have a same structure and a same function.

10. A device, comprising:
    a comparator; and
    control circuitry coupled to the comparator, wherein the control circuitry, in operation, controls testing of a plurality of electronic circuits, each electronic circuit including a test chain having a plurality of test point positions, each test point position storing test data indicative of a state of a component coupled to the test point position, the testing including:
        comparing test data in a last test point position of the test chains of the electronic circuits;
        shifting test data in the test chains of the electronic circuits forward by one test point position, the shifting including writing test data in the last test point position of a test chain to a first test point position in the test chain; and
        repeating the comparing and the shifting until the test data in the last test point position of each test chain when the testing is started is shifted back into the last test point position of the respective test chain.

11. The device of claim 10, wherein the control circuitry comprises:
a plurality of feedback loops, each coupling an input and an output of a respective test chain.

12. The device of claim 11, wherein each feedback loop comprises a multiplexer.

13. The device of claim 10, wherein the comparator comprises an XOR logic gate.

14. The device of claim 10, wherein the plurality of electronic circuits comprises more than two electronic circuits.

15. A system, comprising:
a plurality of electronic devices, each including a test chain having a plurality of test point positions, each test point position storing test data indicative of a state of a component coupled to the test point position; and
testing circuitry, coupled to the plurality of electronic devices, and which, in operation, tests the plurality of electronic devices, the testing including:
comparing test data in a last test point position of the test chains of the electronic devices;
shifting test data in the test chains of the electronic devices forward by one test point position, the shifting including writing test data in the last test point position of a test chain to a first test point position in the test chain; and
repeating the comparing and the shifting until the test data in the last test point position of each test chain when the testing is started is shifted back into the last test point position of the respective test chain.

16. The system of claim 15 wherein the test point positions comprise registers or flip-flops.

17. The system of claim 15, wherein the test data comprises binary words.

18. The system of claim 15, wherein the test data comprises one-bit binary words.

19. The system of claim 15, wherein the electronic devices each comprise a plurality of test chains.

20. The system of claim 15, wherein the plurality of devices comprises more than two devices.

21. The system of claim 15, wherein the testing includes generating an output signal based on the comparing.

22. The system of claim 15, wherein the plurality of electronic devices have a same structure and a same function.

* * * * *